United States Patent [19]

Neumann et al.

[11] Patent Number: 5,122,620
[45] Date of Patent: Jun. 16, 1992

[54] CHIP CARRIER WITH TERMINATING RESISTIVE ELEMENTS

[75] Inventors: Eugene F. Neumann; Melvin C. August, both of Chippewa Falls; James N. Kruchowski, Eau Claire; Stephen Nelson; Richard R. Steitz, both of Chippewa Falls, all of Wis.

[73] Assignee: Cray Research Inc., Eagan, Minn.

[21] Appl. No.: 722,364

[22] Filed: Jun. 25, 1991

Related U.S. Application Data

[60] Continuation of Ser. No. 504,248, Apr. 4, 1990, abandoned, which is a division of Ser. No. 366,604, Jun. 15, 1989, Pat. No. 4,949,453.

[51] Int. Cl.⁵ .................. H01L 23/02; H01C 10/00
[52] U.S. Cl. .................. 174/52.4; 361/392; 361/395; 361/397; 361/402; 338/195
[58] Field of Search .............. 174/52.4, 52.3; 361/380, 390, 392, 394, 395, 397, 398, 399, 400, 401, 402, 403, 407, 412, 414; 338/195, 306, 307, 308, 309, 315, 320; 357/71, 74, 72

[56] References Cited

U.S. PATENT DOCUMENTS

| | | |
|---|---|---|
| 811,859 | 2/1906 | Marsh . |
| 2,662,957 | 10/1950 | Eisler . |
| 2,943,956 | 7/1960 | Robinson . |
| 3,115,423 | 12/1963 | Ashworth . |
| 3,218,194 | 11/1965 | Maissel . |
| 3,256,588 | 6/1966 | Sikina et al. . |
| 3,333,225 | 7/1967 | McNutt . |
| 3,392,054 | 7/1968 | Sapoff et al. . |
| 3,400,066 | 9/1968 | Caswell et al. . |
| 3,423,205 | 1/1969 | Skaggs et al. . |
| 3,489,656 | 1/1970 | Balde . |
| 3,522,085 | 7/1970 | Wantanabe . |
| 3,529,350 | 9/1970 | Rairoen . |
| 3,622,410 | 11/1971 | Carlson . |
| 3,629,776 | 12/1971 | Watane . |
| 3,691,007 | 9/1972 | Paylou . |
| 4,021,277 | 5/1977 | Shirn et al. . |
| 4,026,412 | 5/1977 | Henson . |
| 4,126,758 | 11/1978 | Krumme . |
| 4,266,282 | 5/1981 | Henle et al. . |
| 4,295,183 | 10/1981 | Mierch et al. . |
| 4,338,145 | 7/1982 | Yasujima et al. . |
| 4,407,297 | 10/1983 | Croslin ............ 128/681 |
| 4,426,689 | 1/1984 | Henle et al. . |
| 4,640,436 | 2/1987 | Miyoshi et al. ............ 220/359 |
| 4,677,396 | 6/1987 | Cruz et al. ............ 331/117 R |
| 4,705,917 | 11/1987 | Gates, Jr. et al. ............ 174/52.4 |
| 4,720,770 | 1/1988 | Jameson . |

OTHER PUBLICATIONS

Harold J. Pawluk, Thin Film Resistors Plated on Circuit Boards, Jul. 1967, pp. 62-64.

Primary Examiner—Leo P. Picard
Assistant Examiner—Bot Ledynh
Attorney, Agent, or Firm—Merchant, Gould, Smith, Edell, Welter & Schmidt

[57] ABSTRACT

A generic chip carrier is described which includes, as integral parts, a voltage bus and a plurality of terminating resistors connected between the voltage bus and signal traces on the carrier. The voltage bus wraps around the chip carrier, thus providing a large area of metal. Through the selective use of the terminating resistors, the generic carrier can be customized for a particular type of integrated circuit, i.e., source or destination termination of signals. A signal trace may be customized by "operating" the terminating resistor with a current spike applied by a standard electrical probe. Spare bonding pads and terminating resistors are placed at intervals about the periphery of the carrier as insurance against defective or mistakenly removed terminating resistors.

9 Claims, 3 Drawing Sheets

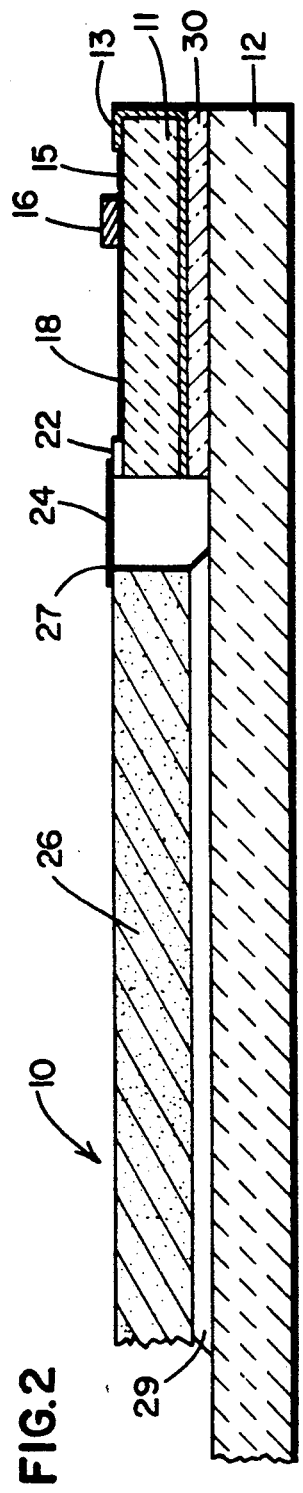
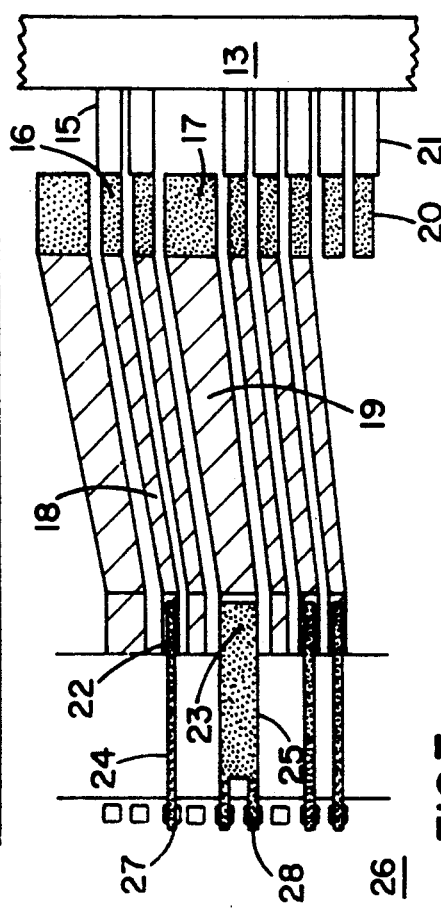
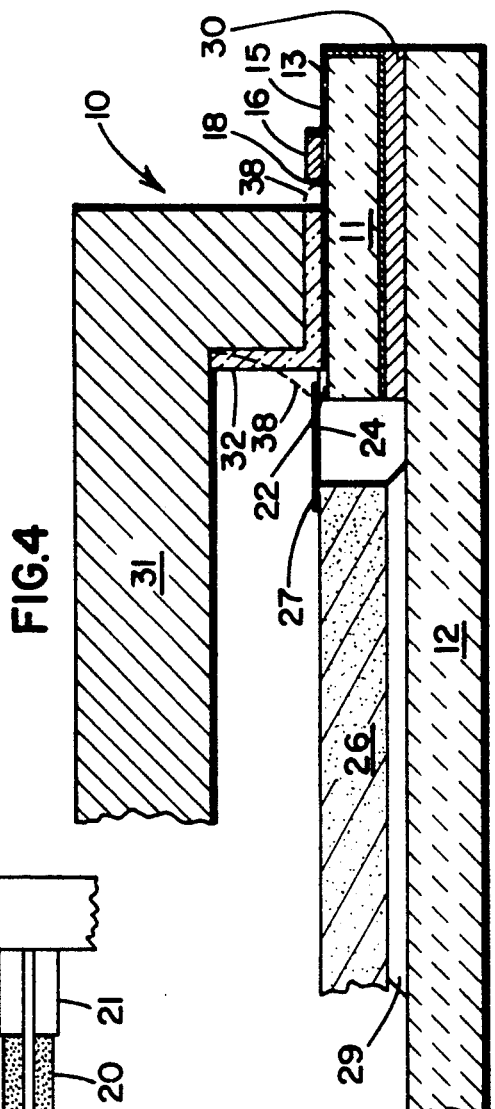
FIG.2
FIG.3
FIG.4

CHIP CARRIER WITH TERMINATING RESISTIVE ELEMENTS

This is a continuation of application Ser. No. 07/504,248 filed Apr. 4, 1990, now abandoned, which is a division of application Ser. No. 07/366,604, filed June 15, 1989, now U.S. Pat. No. 4,949,453, issued Aug. 21, 1990.

FIELD OF THE INVENTION

This invention relates generally to a method of fabricating integrated circuit carriers. In particular, it is directed to a generic integrated circuit carrier which contains resistive elements that selectively perform source or destination termination.

BACKGROUND OF THE INVENTION

At high frequency communication rates, conductive paths such as coaxial wire, twisted pair wire, and circuit board traces, take on a characteristic impedance which must be matched with either source or destination termination resistors to ensure minimal signal reflection. In high speed supercomputers, such as the type manufactured by Cray Research, Inc., the Assignee of the present invention, nearly all conductive paths require such source or destination termination. A significant problem with source or destination termination is that a large portion of the circuit board surface is taken up by resistor components.

In high speed supercomputers, nearly all available space on circuit boards must be given over to logic elements. To maximize speed, the length of conductive paths between logic elements must be short to minimize signal propagation delay. Therefore, integrated circuits must be mounted close together on circuit boards. In the prior art, terminating resistor components are wasteful of circuit board space. Thus, there is a need for integrated circuit packages which contain, as an integral component, terminating resistors of either the source or destination type. The inclusion of terminating resistors must not increase the overall size of the integrated circuit package. Minimizing the "footprint" of each integrated circuit on a circuit board remains a primary goal.

SUMMARY OF THE INVENTION

The present invention solves the aforementioned problems in the prior art and has other advantages which will be readily recognizable by those skilled in the art. One object of the present invention is to provide a method of fabricating generic chip carriers such that its conductive paths may be customized by the selective use of terminating resistors that are an integral part of the carrier. Another object of the present invention is to minimize the footprints of the carrier and associated circuit board by including terminating resistors within the carrier rather than mounting the resistors as separate devices on a circuit board.

BRIEF DESCRIPTION OF THE DRAWINGS

In the drawings, where like numerals refer to like elements throughout the several views.

FIG. 2 is a cross-sectional side view of the integrated circuit bonded to the carrier;

FIG. 3 is an enlarged view of the conductive paths between the integrated circuit and the carrier;

FIG. 4 is a cross-sectional side view of the integrated circuit bonded to the carrier and hermetically sealed by the carrier lid.

DETAIL DESCRIPTION OF THE PREFERRED EMBODIMENT

In the following Detailed Description of the Preferred Embodiment, reference is made to the accompanying Drawings which form a part hereof, and in which is shown by way of illustration a specific embodiment in which the invention may be practiced. It is to be understood that other embodiments may be utilized without departing from the scope of the present invention.

Figure 1:
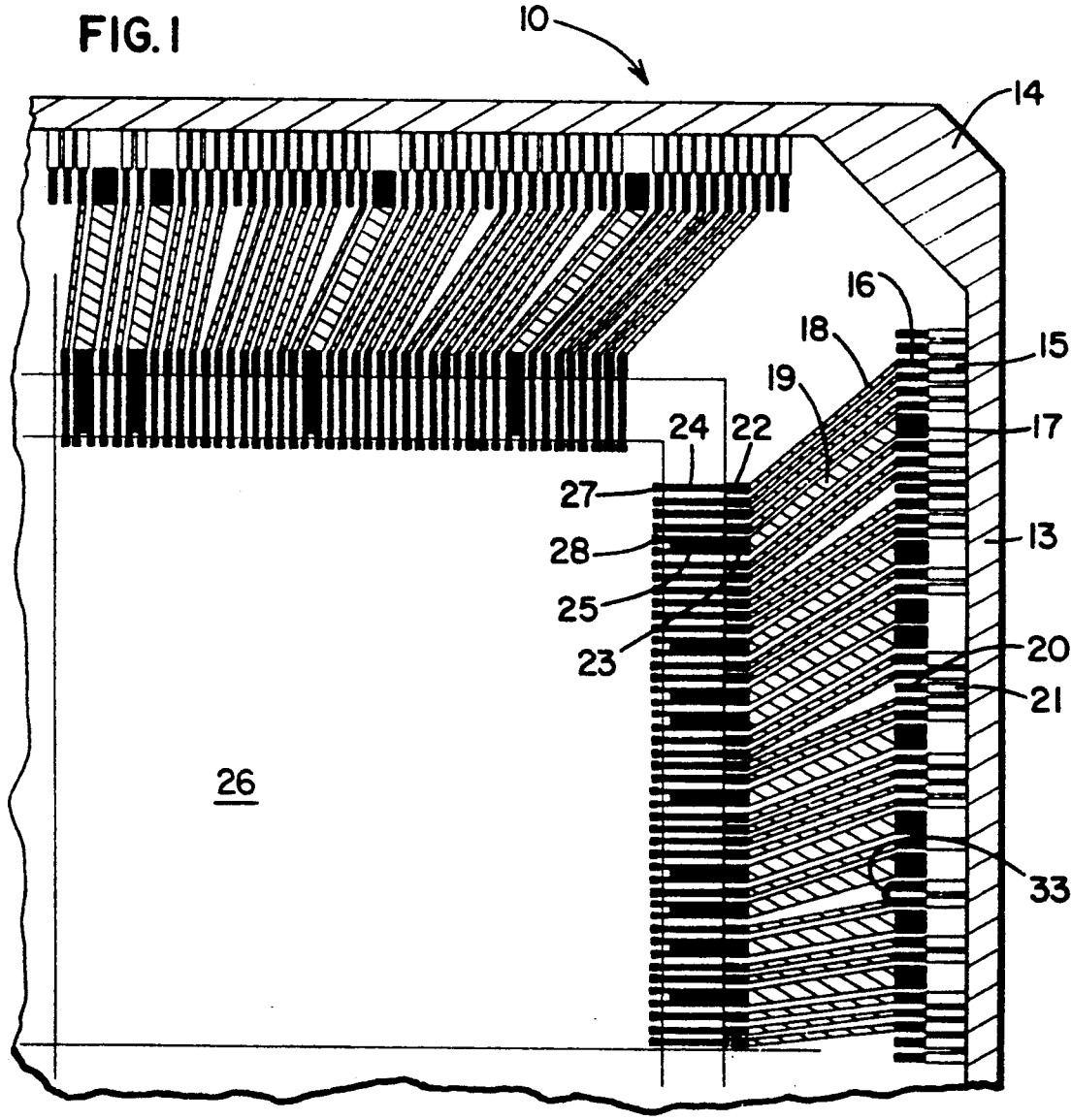
FIG. 1 is a top-down view of the upper right quadrant of an integrated circuit seated in a carrier according to the preferred embodiment of the present invention.

FIG. 1 is a top-down view of the upper right quadrant of an integrated circuit 26 seated in a carrier 10, according to the present invention. In a preferred use of the present invention 10, the integrated circuit 26 is an ECL gate array seated in the center of the carrier 10. The outer periphery of the integrated circuit 26 is lined with bonding pads 27 and 28. Bonding pads 27 are used for signal paths; bonding pads 28 are used for voltage supply paths. Tape Automated Bonding (TAB) traces 24 and 25 electrically connect bonding pads 27 and 28 on the integrated circuit 26 to bonding pads 22 and 23 lining the inner periphery of the carrier 10. Inner bonding pads 22 are used for signal paths; inner bonding pads 23 are used for voltage supply paths. From the inner bonding pads 22 and 23, the electrical connections are brought out by traces 18 and 19 to outer bonding pads 16 and 17 lining the outer periphery of the carrier 10. Outer bonding pads 16 are used for signal paths; outer bonding pads 17 are used for voltage supply paths. The outer bonding pads 16 and 17 are larger and less densely packed than the inner bonding pads 22 and 23, because they connect, by Tape Automated Bonding (TAB) means, to large, bulky, electrical traces on a printed circuit board (not shown). The electrical traces on integrated circuits and their carriers, on the other hand, are usually very small and densely packed. Thus, the traces 18 and 19 fan-out from inner bonding pads 22 and 23 to outer bonding pads 16 and 17 to facilitate electrical connection between the integrated circuit 26 and a printed circuit board.

In the preferred embodiment of the chip carrier 10, a "wraparound" voltage bus 13 is formed as an integral part of the carrier 10. A large area 14 of the voltage bus 13 is exposed in the upper right hand corner of FIG. 1. This exposed area 14 permits connection between the voltage bus 13 and a voltage bus on a printed circuit board. The beveled corner area 14 provides a large, low impedance, bonding pad for connecting the voltage bus 13 on the carrier 10 to a voltage bus on the printed circuit board. A terminating resistive element 15 electrically connects an outer bonding pad 16 on the carrier 10 to the voltage bus 13. The "wraparound" feature of the voltage bus 13 is provided to facilitate additional and/or continuous connection between the voltage bus on the printed circuit board, and the voltage bus 13 on the chip carrier 10, thereby reducing the inductance of the connective path.

The outer bonding pads 17 are not connected to terminating resistive elements 15. The outer bonding pads 17 are dedicated to voltage supply paths. In the preferred embodiment, regardless of chip type, these outer bonding pads 17 and traces 19 must always be used for the supply voltages. The remaining outer bonding pads 16 can be used for any input or output signal. Thus, the present invention provides a generic carrier 10 in which many types of integrated circuits can be placed.

By selective use of the terminating resistors 15, the generic carrier 10 can be customized for a particular type of integrated circuit. For example, the generic carrier 10 can be used for integrated circuits which require destination termination for their input signals. Those skilled in the art will recognize that source termination could be substituted for destination termination. In destination termination only, every input signal is terminated by a resistor; output signals are not terminated. To customize the generic carrier 10, the resistive elements 15 are removed from signals that do not require them. An electrical probe could be used to "open" the resistive elements 15, by means of a large current spike caused to flow between the voltage bus 13 and the bonding pad 16. Alternatively, a laser could be used to open the resistive elements 15.

Spare outer bonding pads 20 and terminating resistive elements 21 are placed at intervals about the periphery of carrier 10. These spares provides some security in case one of the outer bonding pads 16 or resistive elements 15 becomes defective, either because of fabrication problems or because of mistaken removal. In the preferred embodiment, the spare outer bonding pads 20 and resistive elements 21 are placed at intervals of every eight outer bonding pads 16 and 17. Alternative embodiments could choose different intervals. A jumper TAB trace or wire bond 33 can be used to connect the spare outer bonding pad 20 to the desired outer bonding pad 16 or, alternatively, an inner bonding pad 22.

FIG. 2 is a side view of a portion of the carrier 10. Referring to both FIGS. 1 and 2, the carrier 10 in the preferred embodiment is fabricated from two substrate 12 provides a base for a second ceramic substrate 11. The second substrate 11 is shaped to define a central aperture or cavity for receiving the integrated circuit 26. The upper substrate 11 is bonded to the base substrate 12 by a 5 mil thick glass seal 30. The integrated circuit 26 rests on the base substrate 12 and is bonded thereto by means of die bonding adhesive 29. The pads 16, 17, 20, 22, and 23, reside on the surface of the upper substrate 11, and are comprised of conductive bumps. These conductive bumps are built up by sputter-depositing, photolithography, and electroplating as described herein later. Resistive elements 15, made of tantalum nitride or other resistive materials well known to those skilled in the art, are deposited on the upper substrate 11 using thin film techniques and connect the outer bonding pads 16 to the voltage bus 13. Signal traces 18 are deposited on the upper substrate 11 using thin film techniques and connect the outer bonding pads 16 to the inner bonding pads 22. Supply voltage traces 19 are deposited on the upper substrate 11 using thin film techniques and connect the outer bonding pads 17 to the inner bonding pads 23. The TAB traces 24 form conductive paths which span the open space between the integrated circuit 26 and the inner edge of the upper substrate 11, thereby connecting the inner bonding pads 22 to the bonding pads 27 on the integrated circuit 26. The TAB traces 25 also form conductive paths which span the open space between the integrated circuit 26 and the inner edge of the upper substrate 11, thereby connecting the inner bonding pads 23 to the bonding pads 28 on the integrated circuit 26. Those skilled in the art will readily recognize that wire bonds may be substituted for the TAB traces 24 or 25.

FIG. 2 also illustrates the geometry of the wrap-around voltage bus 13. By wrapping the voltage bus 13 around the upper substrate 11, a larger area of metal is available. This large area of metal provides a low impedance voltage bus for the terminating resistors 15, thereby sinking or supplying a large amount of current for the integrated circuit 26 during plural termination of signals.

When a large number of signals require termination, it is important that a sufficient number of electrons be close by on a low impedance voltage bus or ground bus. Otherwise, during plural termination, the local area may be swamped or depleted of electrons. This in turn causes a change in the termination ability of the resistive elements 15, which could result in unwanted reflections on the signal paths. In high-density ECL circuits, these factors become important in terms of timing and noise problems. As the termination voltage shifts, timing delays or errors can occur. In addition, noise problems abound. Often times, intermittent faults will result from sequences that are data-dependent and cannot be easily re-created due to insufficient termination on signal paths.

FIG. 3 is an enlarged view of the critical elements discussed in FIG. 1. The bonding pads 27 and 28 on the integrated circuit 26 are typically 2 mils square with conductive bumps of slightly smaller dimensions built upon the pads to facilitate TAB bonding. The bonding pads 27 and 28 are typically placed on a 4 mil pitch. The bonding pads 27 are connected to the inner bonding pads 22 by 2 mil wide TAB traces 24. The bonding pads 28 are connected to the inner bonding pads 23 by 6 mil wide TAB traces 25.

The inner bonding pads 22 are substantially rectangular, measuring 3 mils by 11 mils with a gold bump 1 mil high thereon. The inner bonding pads 22 are separated from adjacent pads by a distance of 1.5 mils. The inner bonding pads 22 are connected to the outer bonding pads 16 by 2 mil wide traces 18.

The inner bonding pads 23 are substantially rectangular, measuring 7.5 mils by 10 mils with a gold bump 1 mil high thereon. The inner bonding pads 23 are separated from adjacent pads by a distance of 1.5 mils. The inner bonding pads 23 are connected to the outer bonding pads 17 by 6 mil wide traces 19.

The traces 18 and 19 are tapered to fan-out from the width dimensions of the inner bonding pads 22 and inner 23 to the width dimension of the outer bonding pads 16 and 17, respectively.

The outer bonding pads 16 and 20 are substantially rectangular, measuring 3 mils by 11 mils with a gold bump 1 mil high thereon. The outer bonding pads 16 and 20 are separated from adjacent pads by a distance of 1.5 mils.

The outer bonding pads 17 are substantially rectangular, measuring 7.5 mils by 10 mils with a gold bump 1 mil high thereon. The outer bonding pads 17 are separated from adjacent pads by a distance of 1.5 mils.

The resistive elements 15 and 21 are substantially rectangular, measuring 3.5 mils by 12 mils long, as measured along the inner-to-outer periphery axis.

In FIG. 4, a lid 31 is shown hermetically sealed to the upper substrate 11 by a glass seal 38 which starts out as a glass frit 32 before heating. The glass frit 32 is initially bonded to the bottom lip and inside wall of the lid 31. The glass frit 32 extends horizontally over the traces 18 and 19 and vertically abuts the inner bonding pads 22 and 23. When the glass frit 32 is heated, it flows downward over the inner bonding pads 22 and 23 to form the glass seal 38. The flow of glass is indicated generally by the dotted lines labeled with reference number 38. The resulting vertical seal 38 is thin at the top and broad at the base. Those skilled in the art will recognize that non-hermetic sealing may be used, such as an epoxy seal or a "glob-top" adhesive.

Figure 5:
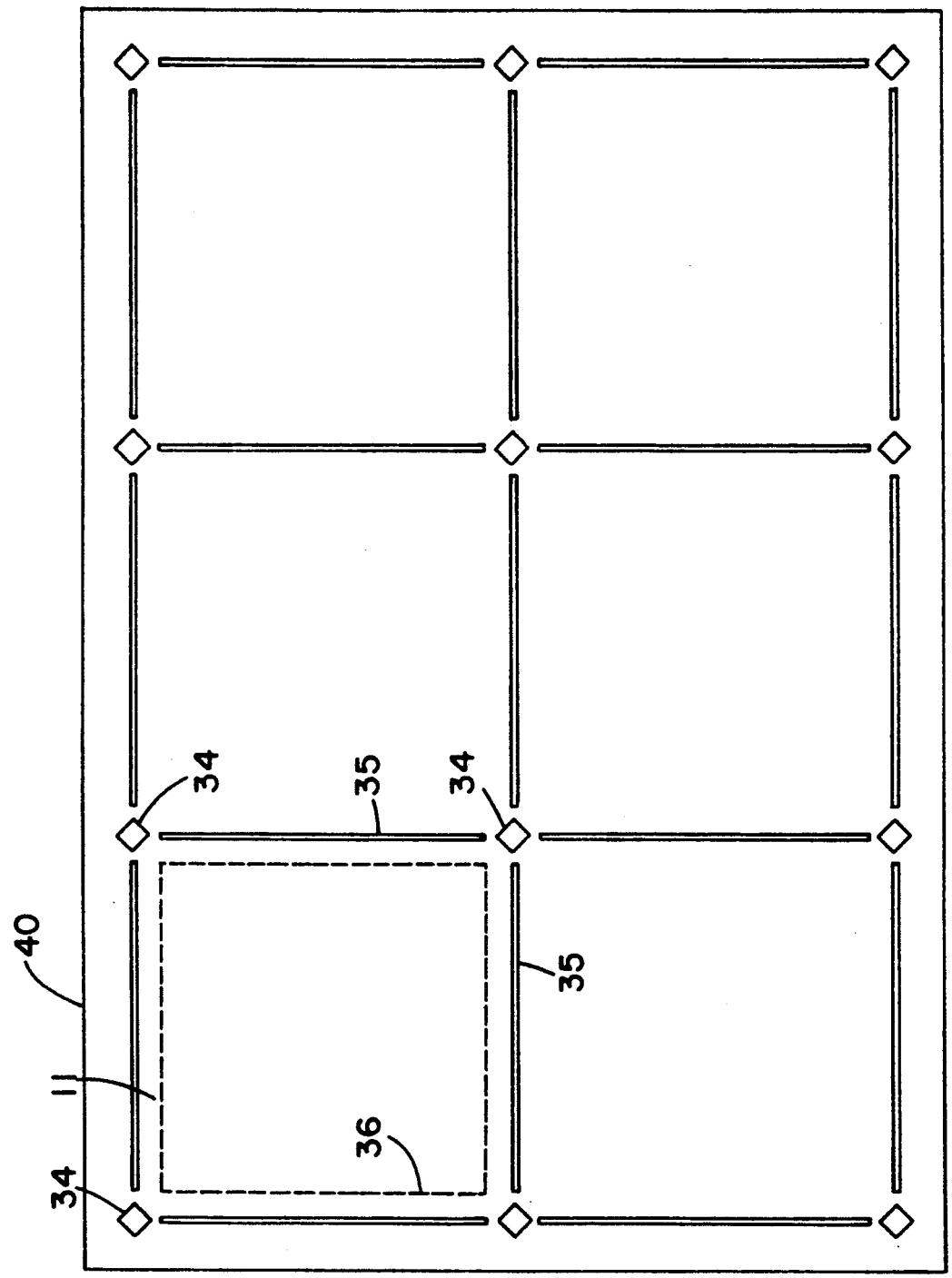
FIG. 5 shows the blank ceramic substrate prior to the metallization process that creates a wraparound voltage bus.

FIG. 5 is a top view of the upper substrate 11 of the carrier 10 prior to fabrication. The fabrication process of the carrier 10 begins with a sheet 40 of blank "green" (unfired) ceramic material. Diamond-shaped holes 34 and elongated, rectangular holes 35 are punched into the soft "green" ceramic sheet 40. The diamond-shaped holes define the beveled corners of the upper substrate 11, discussed herein before in conjunction with FIG. 1. The elongated, rectangular holes 35 define the edges of the upper substrate 11. In an alternative embodiment, the edges could be defined by a plurality of smaller and more numerous segments.

After the "green" ceramic sheet 40 is fired, the metallization of the pads, traces, resistive elements, and voltage bus is performed. Those skilled in the art will recognize that a number of techniques could be used to deposit these elements on the ceramic sheet 40, including electroplating, sputtering, or electroless plating.

In the preferred embodiment, the fired ceramic sheet 40 is first coated with a base metal by sputter-depositing means. The base metal coats the top and bottom surfaces of the fired ceramic sheet 40. The base metal also coats through the holes 34 and 35 of the fired ceramic sheet 40. This provides one uniform, electrically conductive, voltage bus 13 across all surfaces of the ceramic sheet 40. Sputter-depositing the base metal provides a strong bond between the base metal and the ceramic sheet 40.

A photoresist is placed over the coated ceramic sheet 40, a mask is placed over the uncured photoresist, and the photoresist is exposed to light. Those skilled in the art will readily recognize that a positive or negative photoresist may be used. The photoresist is either acid-etched or plasma-etched to provide openings and to expose the portions of the coated ceramic sheet 40 which correspond to the required pads, traces, resistive elements, and voltage bus on the ceramic substrate. The sputter-deposited base metal beneath the photoresist is used as the anode in an electroplating step to build up the voltage bus and the metal traces on the ceramic substrate. Note that the conductive bumps on the pads are further built up by additional sputter-depositing or electroplating means.

Upon completion of the fabrication process, a complete pattern exists, including resistive elements, bonding pads, and the voltage bus. The photoresist is then removed and the substrate is subjected to a mild acid bath to remove the exposed base metal, leaving intact the electroplated metal.

The upper substrate 11 is removed from the ceramic sheet 40 by snapping the sheet 40 along the edges made by the elongated, rectangular holes 35. The center area 36 is cut out with a laser to form the aperture or cavity for the integrated circuit.

Although a specific configuration has been illustrated and described for the preferred embodiment of the present invention set forth herein, it will be appreciated by those of ordinary skill in the art that any arrangement which is calculated to achieve the same purpose may be substituted for the preferred embodiment shown. This application is intended to cover any adaptations or variations of the present invention. For example, although the preferred dimensions of the elements of the present inventions are discussed herein, alternative dimensions could be substituted. Also, the integrated circuit need not be placed in a cavity, but could be placed on the same surface as the traces and resistive elements. In addition, wire bonding, ribbon bonding, or TAB (Tape Automated Bonding) could be used to attach the integrated circuit bonding pads to the connections on the chip carrier. Therefore, it is manifestly intended that this invention be limited only by the claims and equivalents thereof.

What is claimed is:

1. An integrated circuit chip carrier, comprising:
   a substrate, said substrate being metallized on at least two surfaces to form a voltage bus and having an aperture for receiving an integrated circuit;
   a plurality of conductive paths disposed on said substrate for the transmission of electrical signals between an integrated circuit reposing in said aperture and external signal sources; and
   resistive means connected to said plurality of conductive paths and to said voltage bus for providing a resistance between said conductive paths and said voltage bus.

2. The integrated circuit chip carrier according to claim 1 wherein the substrate comprises a fired ceramic sheet coated on the top, bottom and sides with a base metal to form a uniform, electrically conductive voltage bus and then treated to remove portions of the metal coat on the top side of the ceramic sheet so as to present a nonconductive area.

3. The integrated circuit chip carrier according to claim 1 wherein said conductive path comprise an inner pad connected through a trace to an outer pad and wherein said resistive means comprises a first resistive element connected between one of said outer pads and said voltage bus.

4. The integrated circuit chip carrier according to claim 3 wherein said resistive means further comprises a spare resistive element which can be connected to replace a damaged first resistive element.

5. The integrated circuit chip carrier according to claim 1 wherein the chip carrier further comprises a lid which is hermetically sealed to said substance using a glass seal.

6. The integrated circuit chip carrier according to claim 1 wherein the chip carrier further comprises a lid which is sealed to said substrate by an epoxy seal.

7. An integrated circuit chip carrier, comprising:
   a base;
   a substrate attached to said base, said substrate comprising a fired ceramic sheet coated to the top, bottom and sides with a base metal to form a uniform, electrically conductive voltage bus and having an aperture for receiving an integrated circuit to be supported on said base;
   a plurality of pads disposed on the surface of said ceramic substrate and connected through first resistive elements to said voltage bus; and a lid attached to said substrate for hermetically sealing an integrated circuit within the chip carrier, said lid comprising a bottom lip and an inside wall.

8. The integrated circuit chip carrier according to claim 7 wherein the lid further comprises a glass sealing material for bonding said lid to said substrate, said sealing material being bonded to said bottom lip and said inner wall such that, when heated, said sealing material flows downward from the inside wall of said lid to form a hermetic seal between said substrate and said lid.

9. The integrated circuit chip carrier according to claim 7 wherein the chip carrier further includes a spare resistive element that can be connected to replace a damaged first resistive element.

* * * * *

UNITED STATES PATENT AND TRADEMARK OFFICE
CERTIFICATE OF CORRECTION

PATENT NO. : 5,122,620
DATED : June 16, 1992
INVENTOR(S) : Eugene F. Neumann et al.

It is certified that error appears in the above-identified patent and that said Letters Patent is hereby corrected as shown below:

TITLE PAGE:
In [73], replace "Eagan" with --Minneapolis--.

In the Abstract, line 11, please replace "operating" with --opening--.

In column 3, line 41, insert --layers of creamic.A flat substantially square, ceramic-- after the word "two".

In column 6, line 53, replace "substance" with the word --substrate--.

In column 6, line 61, replace "to" with the word --on--.

Signed and Sealed this

Twenty-third Day of November, 1993

Attest:

BRUCE LEHMAN

Attesting Officer    Commissioner of Patents and Trademarks